United States Patent
Kuo et al.

(10) Patent No.: US 8,895,127 B2
(45) Date of Patent: Nov. 25, 2014

(54) METHOD OF CREATING TWO-SIDED TEMPLATE FROM A SINGLE RECORDED MASTER

(75) Inventors: David Kuo, Palo Alto, CA (US);
Gennady Gauzner, San Jose, CA (US);
Kim Yang Lee, Fremont, CA (US)

(73) Assignee: Seagate Technology LLC, Cupertino, CA (US)

(*) Notice: Subject to any disclaimer, the term of this patent is extended or adjusted under 35 U.S.C. 154(b) by 304 days.

(21) Appl. No.: 13/197,059

(22) Filed: Aug. 3, 2011

(65) Prior Publication Data
US 2012/0308783 A1  Dec. 6, 2012

Related U.S. Application Data

(63) Continuation-in-part of application No. 13/149,768, filed on May 31, 2011, now abandoned.

(51) Int. Cl.
| | |
|---|---|
| *G11B 7/24* | (2013.01) |
| *B41C 1/00* | (2006.01) |
| *G03F 7/00* | (2006.01) |
| *G11B 5/855* | (2006.01) |

(52) U.S. Cl.
CPC ............ *B41C 1/00* (2013.01); *G03F 7/0002* (2013.01); *G11B 5/855* (2013.01)

USPC .................. 428/64.1; 428/64.4; 430/270.11

(58) Field of Classification Search
USPC ..................................... 428/64.4; 430/270.11
See application file for complete search history.

(56) References Cited

U.S. PATENT DOCUMENTS

2008/0128944 A1* 6/2008 Wang et al. ............... 264/293
2010/0020443 A1  1/2010 Albrecht et al.

FOREIGN PATENT DOCUMENTS

JP  02154344 A  *  6/1990  ........... G11B 7/26

* cited by examiner

*Primary Examiner* — Elizabeth Mulvaney

(57) ABSTRACT

The embodiments disclose a method of creating two-sided template from a single recorded master, including fabricating a first template using a single recorded master, wherein the first template has a changed duty cycle and an unchanged servo arc orientation, creating a replicate of the first template, wherein the replicate has a mirrored servo arc orientation and a changed duty cycle and fabricating a second template using the replicate to produce a predetermined mirrored servo arc orientation and a predetermined duty cycle for imprinting on a second side of a patterned stack.

20 Claims, 7 Drawing Sheets

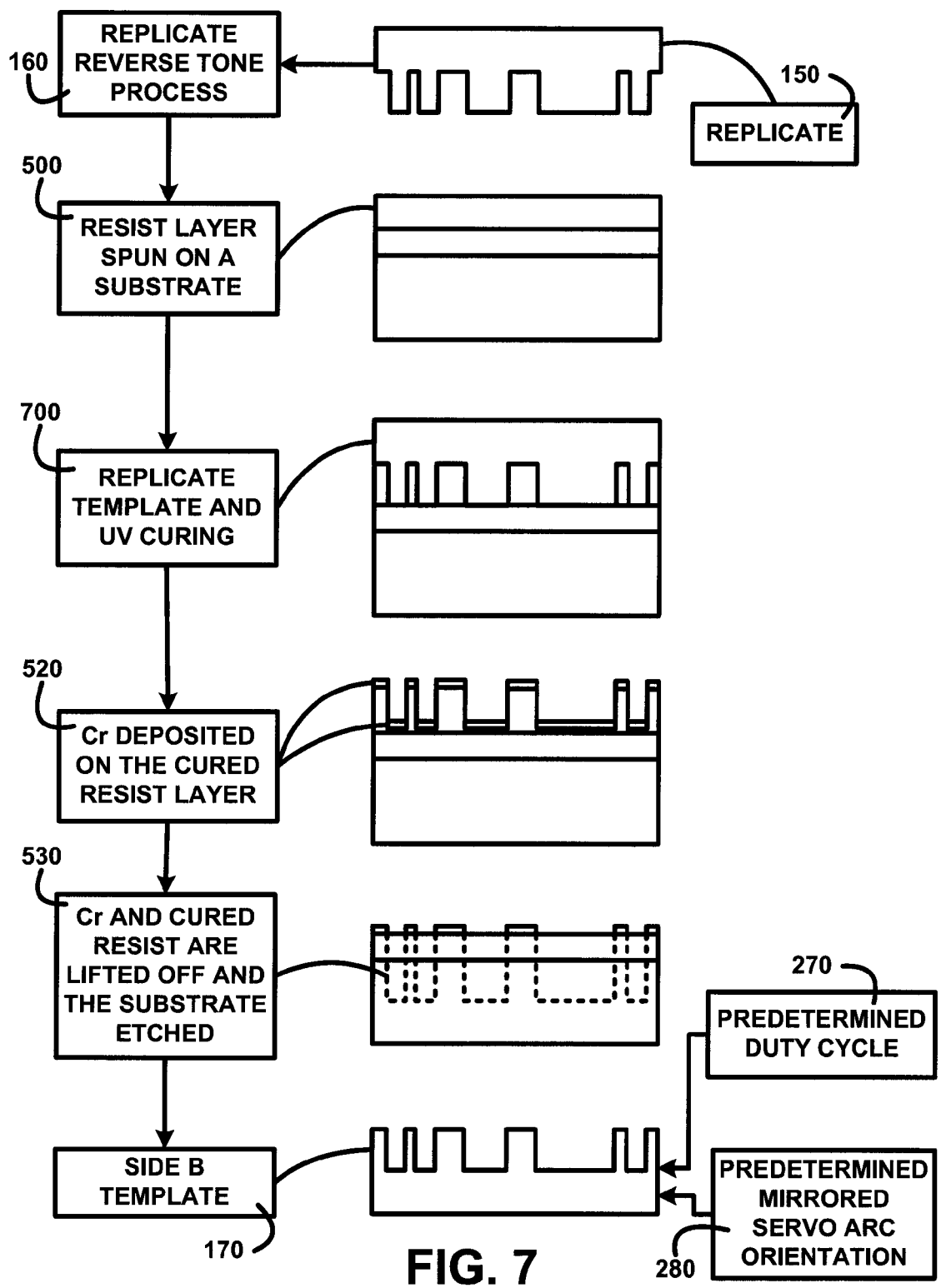

METHOD OF CREATING TWO-SIDED TEMPLATE FROM A SINGLE RECORDED MASTER

CROSS REFERENCE TO RELATED APPLICATIONS

This application is a continuation in part of U.S. patent application Ser. No. 13/149,768 filed on May 31, 2011, which is incorporated herein by reference as though set forth in full.

BACKGROUND

In the past, to create templates for two-sided imprint one has to record two masters. The first of the masters is a master template used to imprint the first side of a stack. The second master template has to include the mirrored servo arc orientation and same land/pitch duty cycle as the first master template. The second master template is used to imprint the second side of the stack. Recording of each master can take days to write.

BRIEF DESCRIPTION OF THE DRAWINGS

FIG. 7 shows for illustrative purposes only an example of fabrication of side B template of one embodiment.

DETAILED DESCRIPTION OF THE INVENTION

In a following description, reference is made to the accompanying drawings, which form a part hereof, and in which is shown by way of illustration a specific example in which the invention may be practiced. It is to be understood that other embodiments may be utilized and structural changes may be made without departing from the scope of the embodiments.
General Overview:

It should be noted that the descriptions that follow, for example, in terms of a method of creating two-sided template from a single recorded master is described for illustrative purposes and the underlying system can apply to any number and multiple types of templates including two-sided templates. In one embodiment, the two-sided template can be configured to fabricate a side B template using separate tone reversed and imprint lithography processes. The process can be configured to include a mix of processes in a the creation of a family of side A and side B templates and can be configured to include a continuous mix of processes to create two-sided templates for use in producing patterned stacks such as bit-patterned media.

Figure 1:
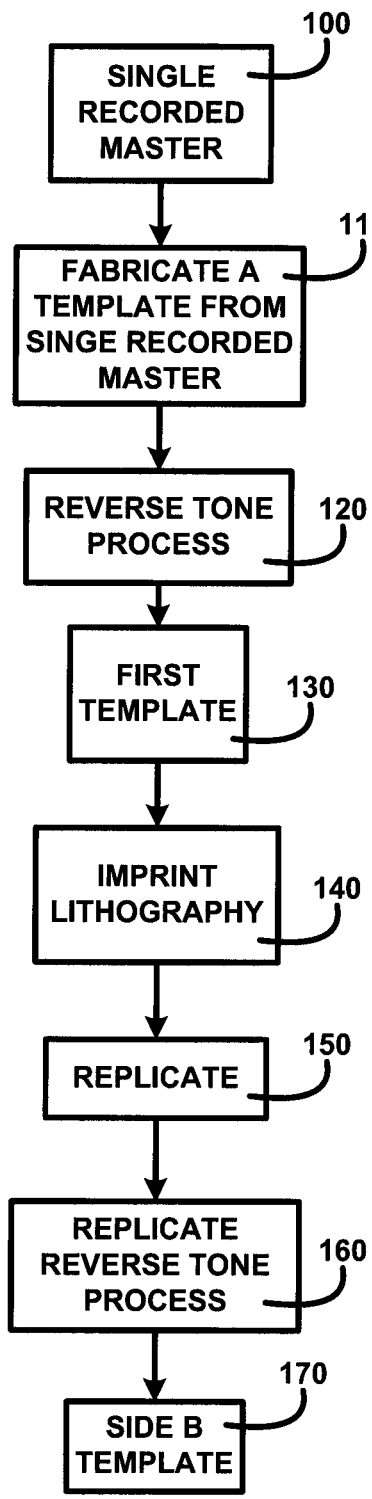
FIG. 1 shows a block diagram of an overview of a method of creating two-sided template from a single recorded master of one embodiment.

FIG. 1 shows a block diagram of an overview of a method of creating two-sided template from a single recorded master of one embodiment. FIG. 1 shows a single recorded master 100 used to produce patterned stacks. Patterned stacks may include stacks where both sides of the stack are patterned, such as bit-patterned stacks. The first side of a two-sided stack may be referred to as side A and the second side may be referred to as side B. The single recorded master 100 is a side A of a two-sided stack disk. Two-sided stacks are used to increase the volume of storage for use in a computer or other digital device. It takes days to write the instructions to a device to fabricate a recorded master template. The method of creating two-sided templates from a single recorded master uses processes to create the flip side B template of the two-side disk to reduce the time to create a second recorded side B template of one embodiment.

The processes to fabricate a template from single recorded master 110 begin with a step using a reverse tone process 120. The reverse tone process 120 creates a first template 130. The first template 130 is fabricated by using a reverse tone process 120 with a change in the duty cycle but without changing the servo arc orientation. The duty cycle is reversed. In one embodiment the reverse tone process 120 may include a Cr lift off process. The Cr lift off process may include the directional deposition of Chromium (Cr) on top of an exposed patterned resist.

The next step in the Cr lift off process may include a high pressure reactive ion etching process to remove the Cr on top of the elevated resist topography. A resist ashing process may be used to strip off the elevated resist topography resist mask. A reactive ion etching process is may be used to etch into the quartz template and the remaining Cr may be removed using a wet removal process of one embodiment. This creates the first template 130. The next step is to use an imprint lithography 140 process to create a replicate 150 of the first template 130. The replicate 150 will mirror the arc orientation and reverse the duty cycle changed in the first template 130.

The replicate 150 is used in a replicate reverse tone process 160. The replicate reverse tone process 160 creates a side B template 170 which mirrors the servo arc orientation and creates the predetermined duty cycle to that of the single recorded master 100. The side B template 170 is paired with the single recorded master 100 side A master template to fabricate two-sided stacks. The side B template 170 will include the correct or predetermined values of the duty cycle land and pitch to form the predetermined duty cycle. The side B template 170 will include the correct or predetermined values of the servo arc orientation to form the predetermined mirrored servo arc orientation. The side B template 170 is fabricated in reduced time with the predetermined duty cycle and predetermined mirrored servo arc orientation of one embodiment.

The method of creating two-sided template from a single recorded master uses a process to mix reverse tone and imprint processes to create a family of side A and side B templates. The method of creating two-sided template from a single recorded master reduces template fabrication time and is cost effective. The time savings keeps the production of patterned stack media running smoothly with the capability of creating a large number of two-sided templates in a short time of one embodiment.

DETAILED DESCRIPTION

Figure 2:
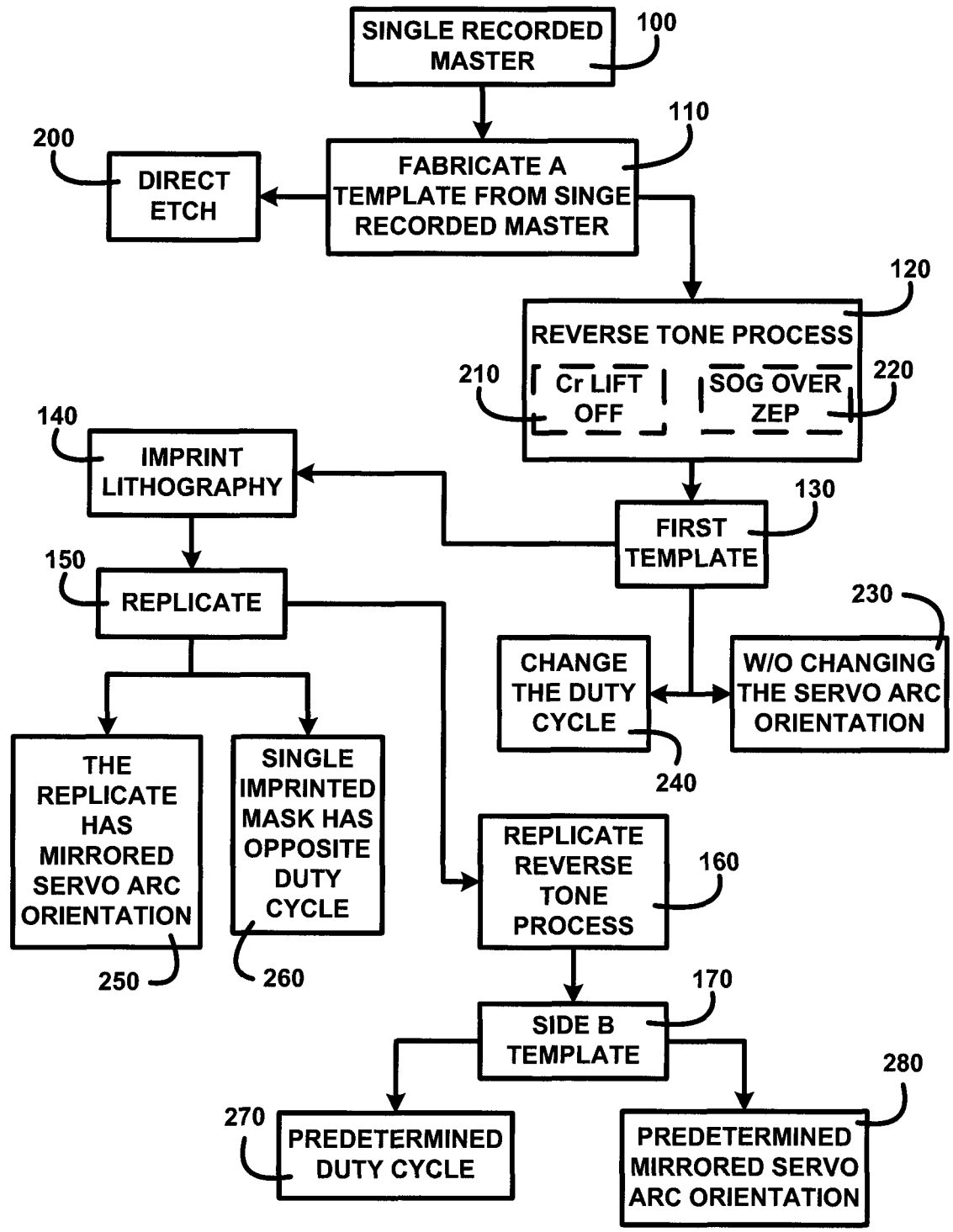
FIG. 2 shows a block diagram of an overview flow chart of a method of creating two-sided template from a single recorded master of one embodiment.

FIG. 2 shows a block diagram of an overview flow chart of a method of creating two-sided template from a single recorded master of one embodiment. FIG. 2 shows the single recorded master 100 used by the method of creating two-sided template from a single recorded master to fabricate a template from singe recorded master 110. The reverse tone process 120 is used to fabricate the first template 130 of one embodiment.

The reverse tone process 120 includes processes such as Cr. Lift off 210 and SOG over ZEP 220. Spin-on-glass (SOG) is a glass-like material that may include organic and inorganic chemicals. The SOG may be spin-coated over a negative resist such as ZEP, which is one commercially available e-beam negative resist. The use of a negative resist such as ZEP may result in the exposed part remaining as a pattern when an image developing process is carried out after exposure. The process to fabricate a template from singe recorded master 110 may also include a direct etch 200 process of one embodiment.

The first template 130 is affected by the reverse tone process 120. The reverse tone process 120 is performed without (w/o) changing the servo arc orientation 230. The other effect on the first template 130 mask is to change the duty cycle 240. The change in the duty cycle does not work on the side B of a stack of one embodiment.

The next step uses the first template 130 in the imprint lithography 140 to mirror the servo arc orientation of the single recorded master 100. The imprint lithography 140 uses the first template to create the replicate 150. The replicate has mirrored servo arc orientation 250. The replicate 150 forms a single imprinted mask. The single imprinted mask has opposite duty cycle 260. The replicate 150 is used to create a template for reversing the opposite duty cycle while maintaining the mirrored servo arc orientation of one embodiment.

The replicate reverse tone process 160 uses the replicate 150 as a mold to create the side B template 170. In the replicate reverse tone process 160 the mirrored servo arc orientation is maintained. The etching process of the replicate reverse tone process 160 reverses the duty cycle. The side B template 170 is fabricated with the predetermined duty cycle 270 and the predetermined mirrored servo arc orientation 280. The side B template 170 can be used with the side A template in a two-sided production of stacks. The method of creating two-sided template from a single recorded master reduces the time to fabricate two-sided templates without the time for writing a set of side B template instructions. This is cost effective and speeds the process for allowing increased production of one embodiment.

Figure 3A:
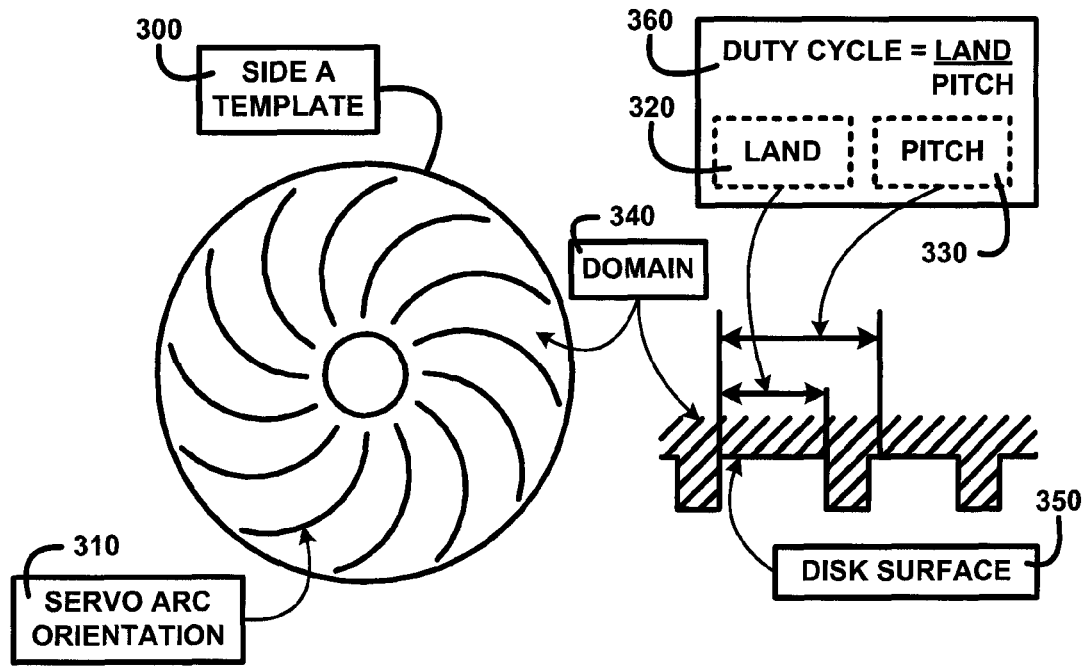
FIG. 3A shows for illustrative purposes only an example of servo arc orientation and duty cycle of one embodiment.

Servo Arc Orientation and Duty Cycle:

FIG. 3A shows for illustrative purposes only an example of servo arc orientation and duty cycle of one embodiment. FIG. 3A shows a side A template 300 with the servo arc orientation 310 in one direction. The duty cycle is the time for the stack disk to process data and is a ratio of the land 320 and pitch 330. The domain 340 is an area of magnetic materials on the stack. The measurements of the land 320 and pitch 330 are taken on the disk surface 350 to calculate the duty cycle=land/pitch 360 of one embodiment.

Figure 3B:
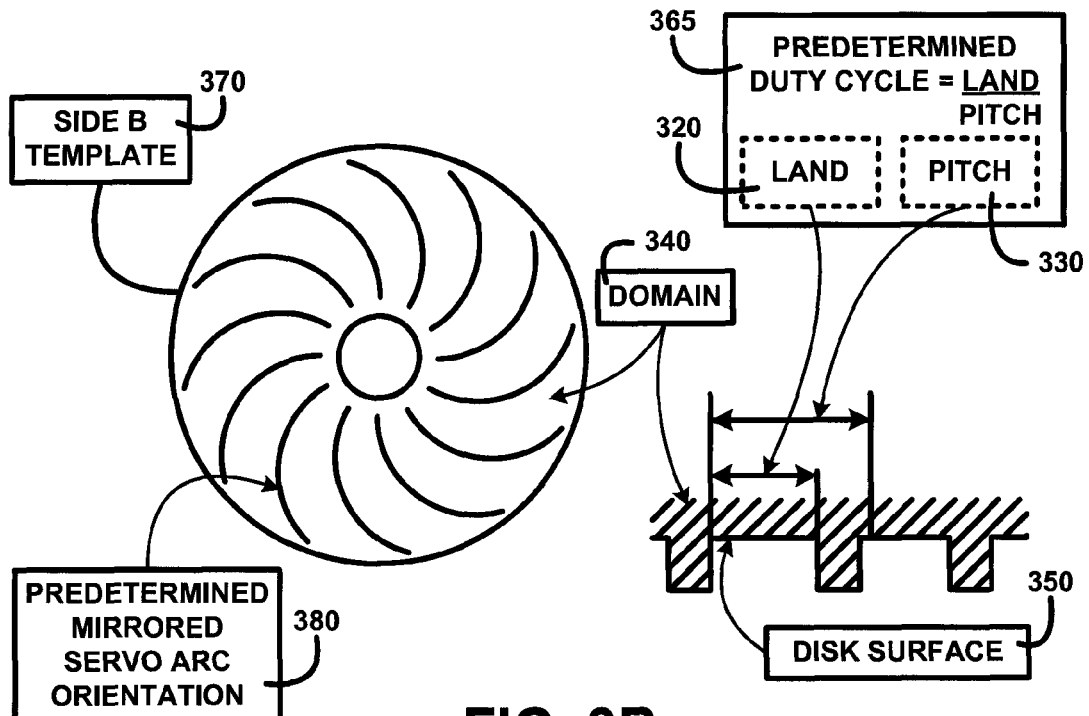
FIG. 3B shows for illustrative purposes only an example of predetermined mirrored servo arc orientation and duty cycle of one embodiment.

Predetermined Servo Arc Orientation and Duty Cycle:

FIG. 3B shows for illustrative purposes only an example of predetermined mirrored servo arc orientation and duty cycle of one embodiment. A side B template 370 is shown with a predetermined mirrored servo arc orientation 380. The disk face when reversed to the opposite side of the side A template 300 of FIG. 3A matches the arc of the servo arc orientation 310 of FIG. 3A. The land 320 and pitch 330 match to that of the side A template but is not mirrored. The domain 340 and disk surface 350 are a match and the predetermined duty cycle=land/pitch 365 ratio is read in the same orientation as the duty cycle on the side A template 300. Changes of the duty cycle of the single recorded master 100 of FIG. 1 that occur in the reverse tone process 120 of FIG. 1 that forms the first template 130 of FIG. 1 would prevent an accurate reading of the domain 340 data. The servo arc orientation of the single recorded master 100 of FIG. 1 is not changed in the reverse tone process 120 of FIG. 1 which unmirrored would create a mismatch of the servo data between the two sides of a double sided stack and prevent accurate read write head positioning of one embodiment.

Figure 4:
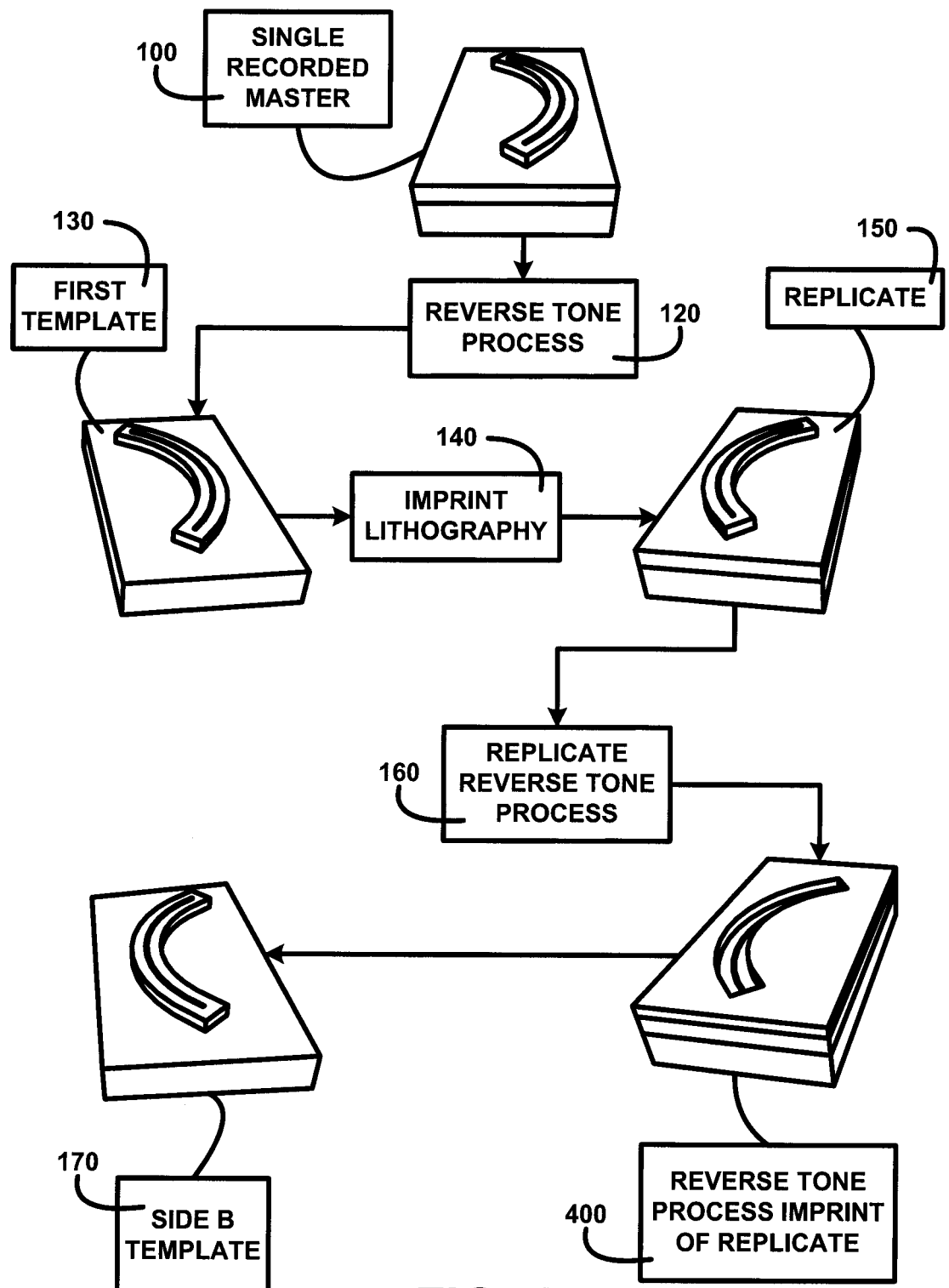
FIG. 4 shows for illustrative purposes only an example of predetermined mirrored servo arc orientation of one embodiment.

Mirrored Servo Arc Orientation:

FIG. 4 shows for illustrative purposes only an example of predetermined mirrored servo arc orientation of one embodiment. FIG. 4 shows the single recorded master 100 being used to create the first template 130 in the reverse tone process 120. The servo arc orientation is illustrated as a single servo arc segment and is exaggerated in size to make it easier to visualize of one embodiment.

In the first template 130 the servo arc orientation is not mirrored. In the imprint lithography 140 used to create the replicate 150 wherein the servo arc orientation is mirrored. The imprint lithography 140 creates opposite duty cycle. This allows the duty cycle to be reversed in the replicate reverse tone process 160. The replicate reverse tone process 160 etches the predetermined mirrored servo arc orientation from the imprint lithography into the resist during a reverse tone process imprint of replicate 400. The etched form acts as a mold when the side B template 170 is created. This maintains the predetermined mirrored servo arc orientation of one embodiment.

Figure 5:
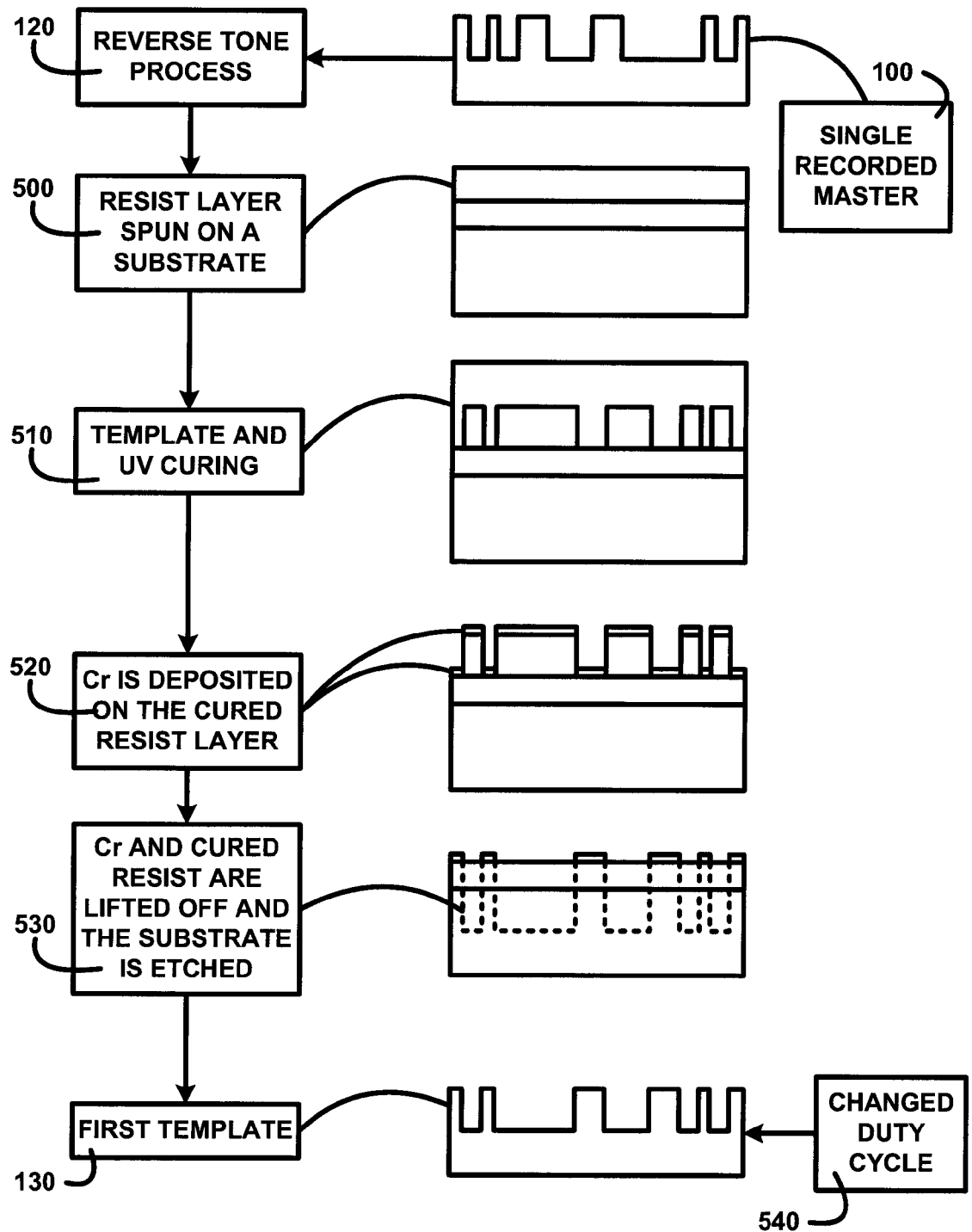
FIG. 5 shows for illustrative purposes only an example of fabrication of first template of one embodiment.

First Template:

FIG. 5 shows for illustrative purposes only an example of fabrication of first template of one embodiment. The single recorded master 100 is used in the reverse tone process 120 to create the first template 130. The reverse tone process 120 begins with a resist layer spun on a substrate 500 and adhesion layer coating that is spun on the substrate. The single recorded master 100 is placed on the resist layer. The resist materials fill the recesses of the inverted single recorded master 100 by capillary action. Ultra violet light is projected through the single recorded master 100 imprint template and UV curing 510 hardens the resist. The imprint template is demolded and chromium (Cr) is deposited on the cured resist layer 520. The Cr is hardened and the next step is the Cr and cured resist are lifted off and the substrate is etched 530. The remaining Cr and adhesion layer are removed. The etched substrate forms the first template 130. The first template 130 has changed duty cycle 540 and the servo arc orientation is unchanged of one embodiment.

Figure 6:
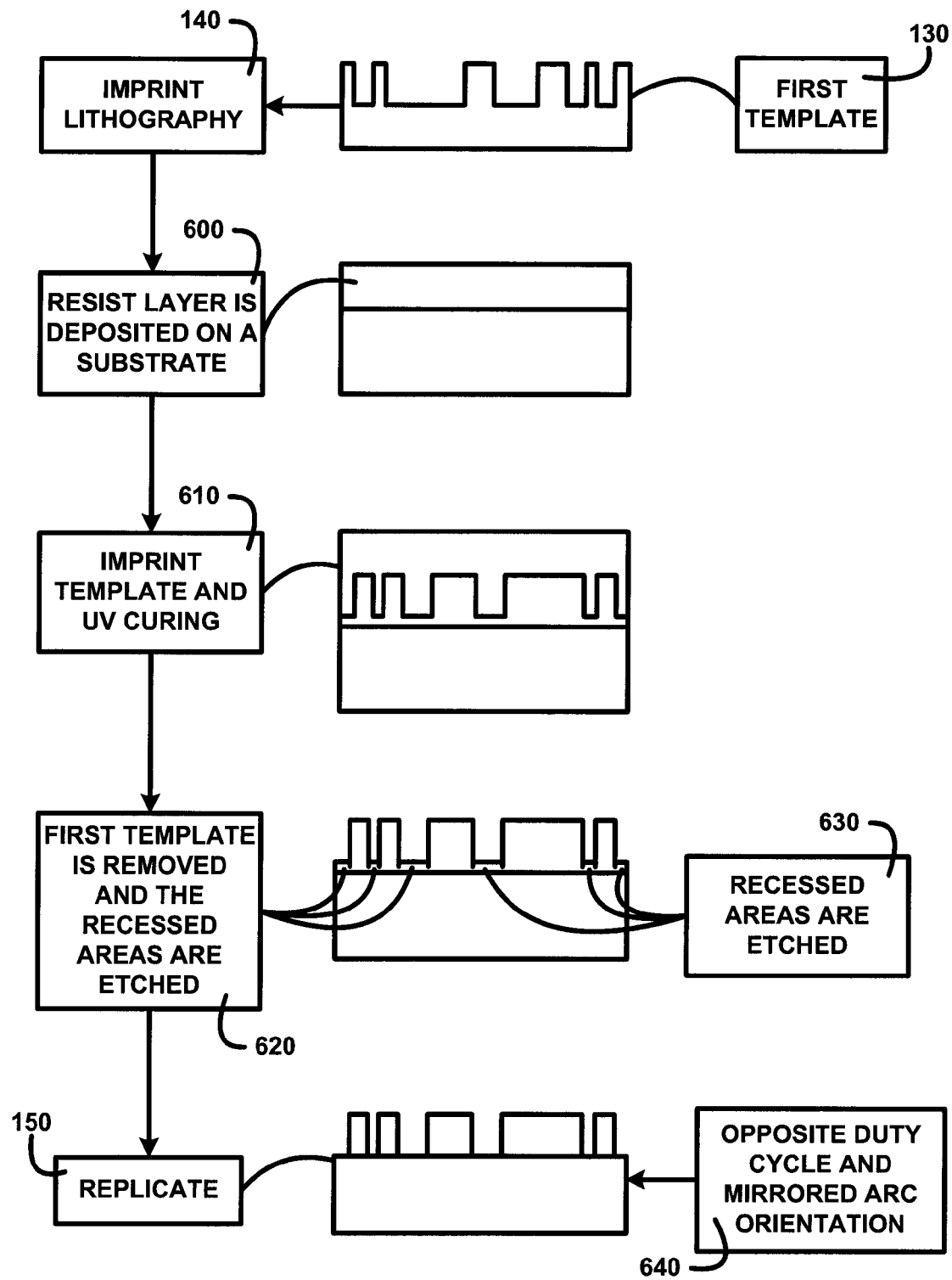
FIG. 6 shows for illustrative purposes only an example of fabrication of replicate of one embodiment.

Replicate:

FIG. 6 shows for illustrative purposes only an example of fabrication of replicate of one embodiment. FIG. 6 shows the first template 130 being used in an imprint lithography 140 process to mirror the servo arc orientation of the single recorded master 100 in a replicate 150 template. A resist layer is deposited on a substrate 600. The first template 130 is inverted and positioned into the resist layer on an imprint template and UV curing 610 of the resist is performed. UV light is exposed onto the inverted template and passes through to cure and harden the resist layer. The inverted template is positioned to rest on a cushion of the resist material which becomes compressed recesses. The first template is removed and the recessed areas are etched 620. The recessed areas are etched 630 to the surface of the substrate. The etched hardened resist and substrate form the replicate 150. The replicate 150 is a hardened template with opposite duty cycle and mirrored arc orientation 640 of one embodiment.

Side B Template:

FIG. 7 shows for illustrative purposes only an example of fabrication of side B template of one embodiment. FIG. 7 shows the process to create a side B template that includes the predetermined duty cycle 270 and the predetermined mirrored servo arc orientation 280. The replicate 150 is used in the replicate reverse tone process 160. The replicate reverse tone process 160 next step is a resist layer spun on a substrate 500. The substrate has an adhesion layer that was deposited prior to the resist layer. The replicate template and UV curing 700 processing is next. The replicate template is inverted and set into the resist material. The replicate template is a transparent material for example quartz through which ultra violet (UV) light shines through to cure the resist layer. When the UV light cured resist is hardened the replicate template is removed in a demold operation.

Chromium (Cr) is deposited on the cured resist layer 520. The deposited Cr is hardened. A process using for example a solvent is used wherein the Cr and cured resist are lifted off and the substrate is etched 530. The remaining Cr deposited on the adhesion layer acts as a mask during the etching process. After etch is completed the remaining Cr and adhesion layer are removed. The etched substrate forms the side B template 170. The side B template 170 has the predetermined duty cycle 270 and predetermined mirrored servo arc orientation 280. The side B template 170 is ready to be used in fabricating two-sided patterned stacks of one embodiment.

The foregoing has described the principles, embodiments and modes of operation of the present invention. However, the invention should not be construed as being limited to the particular embodiments discussed. The above described embodiments should be regarded as illustrative rather than restrictive, and it should be appreciated that variations may be made in those embodiments by workers skilled in the art without departing from the scope of the present invention as defined by the following claims.

What is claimed is:

1. A method of creating two-sided template from a single recorded master, comprising:
    fabricating a side A first template using a single recorded side A master, wherein the side A first template has a changed duty cycle and an unchanged servo arc orientation;
    creating a replicate of the first template, wherein the replicate has a mirrored servo arc orientation and a changed duty cycle;
    fabricating a side B second template using the replicate to produce a predetermined mirrored servo arc orientation and a predetermined duty cycle; and
    using a mix of reverse tone, imprint and etch processes to create the side A first template etched substrate and the side B second template etched substrate for use in fabricating a two-sided patterned stack.

2. The method of claim 1, further comprising using a template design to form a first side template as the single recorded master.

3. The method of claim 1, wherein the first template is fabricated using a reverse tone process with one of a chromium lift off process or a spin-on-glass over a negative resist process.

4. The method of claim 1, wherein the first template is fabricated using a direct etching process.

5. The method of claim 1, wherein the replicate is created using an imprint lithography process to create a mirrored servo arc orientation.

6. The method of claim 1, wherein the second side template is fabricated using a reverse tone process with one of a direct etch, chromium lift off or spin-on-glass over a negative resist.

7. The method of claim 1, further comprising the fabrication of templates using a process to mix reverse tone and imprint processes to create a family of first side and second side templates for use in the production of two-sided patterned stacks.

8. The method of claim 1, wherein the servo arc orientation is mirrored using the replicate to fabricate a second side template using a reverse tone process.

9. The method of claim 1, wherein the second side template is fabricated from a single recorded master to reduce the time for mastering templates for the fabrication of patterned stacks.

10. The method of claim 1, further comprising using two-sided templates for the fabrication of two-sided patterned stacks using a single recorded master.

11. The method of claim 1, wherein the fabricating of a second template with predetermined mirrored servo arc orientation and predetermined duty cycle is performed from a single recorded master for use in the fabrication of two-sided patterned stacks.

12. An apparatus, comprising:
    means for fabricating a side A first template using a single recorded side A master to create a replicate;
    means for creating a replicate of the side A first template to mirror the servo arc orientation and reverse the duty cycle;
    means for fabricating a side B second template using the replicate to produce a predetermined mirrored servo arc orientation and a predetermined duty cycle of the single recorded master; and
    means for using a mix of reverse tone, imprint and etch processes to create the side A first template etched substrate and the side B second template etched substrate for use in fabricating two-sided patterned stacks.

13. The apparatus of 12, further comprising means for using a single recorded master to create a first template using a reverse tone process.

14. The apparatus of 12, further comprising means for creating a replicate of the first template using imprint lithography.

15. The apparatus of 12, further comprising means for using the replicate to fabricate a second side template using a reverse tone process to produce the predetermined mirrored servo arc orientation and predetermined duty cycle of the single recorded master.

16. The apparatus of 12, further comprising means for mixing reverse tone and imprint lithography processes to create a family of first side and second side templates for use in the two-sided fabrication of patterned stacks.

17. A second side template, comprising:
    a predetermined mirrored servo arc orientation; and
    a predetermined duty cycle, wherein the predetermined mirrored servo arc orientation and the predetermined duty cycle are created using a single recorded master for two-sided fabrication of patterned stacks.

18. The second side template of claim 17, further comprising using a reverse tone process to fabricate a first template.

19. The second side template of claim 17, further comprising using a mixed process including a reverse tone process to fabricate the first template and an imprint lithography process to fabricate a replicate of the first template.

20. The second side template of claim 19, wherein the mixed process creates a family of first side and second side templates for use in the two-sided fabrication of patterned stacks.

\* \* \* \* \*